United States Patent
Kim

(10) Patent No.: US 8,698,130 B2
(45) Date of Patent: Apr. 15, 2014

(54) ORGANIC LIGHT EMITTING DISPLAY WITH PIXELS HAVING DIFFERENT SHAPES AND MANUFACTURING METHOD THEREOF

(75) Inventor: Jongyun Kim, Youngin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 1008 days.

(21) Appl. No.: 11/986,864

(22) Filed: Nov. 26, 2007

(65) Prior Publication Data
US 2008/0246027 A1     Oct. 9, 2008

(30) Foreign Application Priority Data
Apr. 6, 2007   (KR) .......... 10-2007-0034286

(51) Int. Cl.
*H01L 27/32*     (2006.01)
(52) U.S. Cl.
USPC .................. 257/40; 257/E51.019
(58) Field of Classification Search
USPC ............ 257/40, E51.002, E51.019
See application file for complete search history.

(56) References Cited

U.S. PATENT DOCUMENTS

| | | | |
|---|---|---|---|
| 6,771,028 B1 * | 8/2004 | Winters | 315/169.1 |
| 2004/0217694 A1 * | 11/2004 | Cok et al. | 313/504 |
| 2006/0114394 A1 * | 6/2006 | Yamzaki | 349/139 |
| 2006/0290274 A1 * | 12/2006 | Oota | 313/506 |

FOREIGN PATENT DOCUMENTS

| | | |
|---|---|---|
| JP | 2004-214256 | 7/2004 |
| JP | 2007-42443 | 2/2007 |
| KR | 10-2005-0116540 | 12/2005 |
| KR | 10-2006-0067433 | 6/2006 |
| KR | 10-2008-0001102 | 1/2008 |

OTHER PUBLICATIONS

Office action dated Nov. 9, 2010 issued by the Japanese Patent Office citing the Japanese equivalent of Korean Application No. 10-2007-0034286 (i.e. JP 2007-42443).
Notice of Allowance dated Jun. 30, 2008 issued by the Korean Patent Office in priority Korean Application No. 10-2007-0034286.

* cited by examiner

*Primary Examiner* — Thomas L Dickey
(74) *Attorney, Agent, or Firm* — Knobbe Martens Olson & Bear LLP

(57) ABSTRACT

An organic light emitting display and a fabricating method thereof, where the display has sub-pixels of various types, which have distinctive shapes formed therein according to type is disclosed. Pixels of a particular type e.g., red, green, or blue, can be identified through visual recognition of the distinctive pattern.

15 Claims, 15 Drawing Sheets

ORGANIC LIGHT EMITTING DISPLAY WITH PIXELS HAVING DIFFERENT SHAPES AND MANUFACTURING METHOD THEREOF

CROSS-REFERENCE TO RELATED APPLICATION

This application claims priority to and the benefit of Korean Patent Application No. 10-2007-0034286, filed on Apr. 6, 2007, the entire content of which is incorporated herein by reference.

BACKGROUND

1. Field

The field relates to an organic light emitting display and a fabricating method thereof, and more particularly to an organic light emitting display and a fabricating method wherein a color of a pixel can be determined based on a distinctive pattern of an element of the pixel. The pattern may, for example, be in at least one of a lower electrode of the capacitor and an anode. Consequently, a cause of a pixel defect can be determined more easily.

2. Description of the Related Technology

In general, an organic light emitting display is a device wherein light is generated as an electron and a hole combine with each other near a fluorescent or phosphorescent chemical compound by injecting a hole into an anode and an electron into a cathode.

As shown in FIG. 1, the organic light emitting display is basically composed of an anode (ITO: Indium Tin Oxide), an organic thin film, and a cathode e(Metal). The organic thin film may include an emitting layer (EML) which generates light by forming an exciton as an electron and a hole meet each other, an electron transport layer (ETL) transporting an electron, and a hole transport layer transporting a hole. Additionally, an electron injecting layer (EIL) can also be formed on one side of the electron transport layer, and a hole injecting layer (HIL) can also be formed on one side of the hole transport layer.

A passive matrix method and an active matrix method are well known driving methods for driving the organic light emitting diode. The passive matrix method has advantages in that the fabricating process is simple, and the investment is small because an anode and a cathode are formed so that they cross each other in an orthogonal direction. In addition, the organic light emitting diode is driven as a line is selected. However, it also has disadvantages in that the current consumption can be large when an image is displayed on a large size display. The active matrix method is beneficial in that the current consumption is small, the image quality is excellent, the lifetime is long, and it can be a medium large size because an active element and a storage capacitor such as a thin film transistor are formed for each pixel.

A fabricating method of the organic light emitting display may include a crystallization step of amorphous silicon, a step of manufacturing of an active layer (a thin film transistor and a lower electrode of the capacitor), and a step of manufacturing of an organic light emitting diode. There are other steps such as an encapsulation step and a module assembly step. However, the description about these steps will be omitted.

The crystallization step of amorphous silicon may include a substrate cleaning step, a buffer layer forming step, an amorphous silicon evaporating step, and a poly silicon forming step and so forth.

In addition, the step of manufacturing of an active layer includes a step of patterning the poly silicon, a step of forming a gate insulating layer, an ion injection/activation step, a step of forming an interlayer dielectric layer, a step of forming a contact hole, and a step of patterning of source/drain electrode and so on. A step of forming an insulating layer and via, a step of forming an ITO, and a step of forming a pixel definition layer are executed additionally.

Meanwhile, in the fabricating method of the organic light emitting display, an inspection step is executed to detect inferior goods which does not show an excellent emission characteristic. It can take much time to determine a cause of a defect accurately, thus, productivity can be decreased.

In a high resolution organic light emitting display, an undesirable short circuit may happen because a distance between adjacent wires decreases, which is an important cause of a defect. Accordingly, a lighting test and so forth can be executed to determine at which region from among a RGB pixel an undesirable short circuit which can be a cause of a defect happens.

Conventionally, in case that the aperture ratio of a pixel generating red, green, and blue light is the same, a diode evaporated on a substrate is formed so that the same pattern is formed at each RGB pixel. Accordingly, before an organic material is evaporated, RGB cannot be distinguished with the pattern. Consequently, it has a disadvantage that it takes much time to determine a cause of a defect accurately.

SUMMARY OF CERTAIN INVENTIVE ASPECTS

One aspect is an organic light emitting display, including a substrate, an active layer formed on the substrate, a gate insulating layer formed on the active layer, a gate electrode formed on the gate insulating layer in a location corresponding to the active layer, an interlayer dielectric layer formed on the gate electrode, a source or drain electrode formed on the interlayer dielectric layer and coupled to the active layer, an insulating layer formed on the source or drain electrode, and an organic light emitting diode formed on the insulating layer and coupled to the source or drain electrode, where pixels of at least first and second types are formed, and at least one pixel has a distinctive shape corresponding to the type of the at least one pixel.

Another aspect is a fabricating method of an organic light emitting display, the method including preparing a substrate, evaporating amorphous silicon on the substrate, crystallizing the amorphous silicon into poly silicon, forming an active layer using the poly silicon, forming an organic light emitting diode coupled to the active layer, where pixels of at least first and second types are formed, and forming a distinctive shape in at least one pixel, the distinctive shape according to the type of the at least one pixel.

BRIEF DESCRIPTION OF THE DRAWINGS

The above and other aspects, features and advantages will be more apparent from the following detailed description taken in conjunction with the accompanying drawings, in which.

DETAILED DESCRIPTION OF CERTAIN INVENTIVE EMBODIMENTS

Hereinafter, certain embodiments will be described with reference to the accompanying drawings as particularly as those skilled in the art can practice the present invention.

Figure 1:
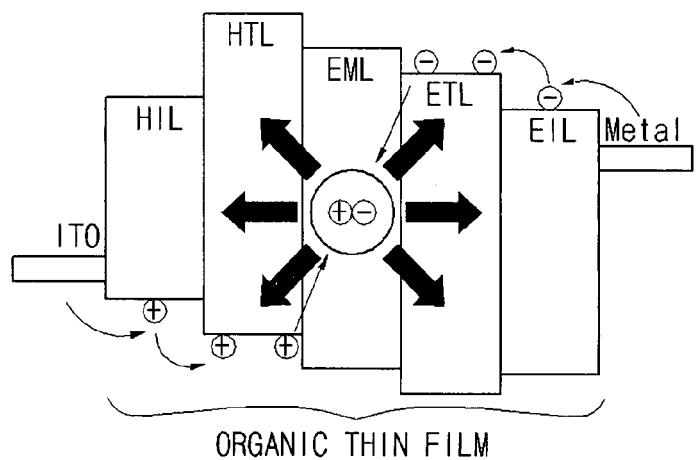
FIG. 1 is a schematic drawing illustrating how an organic light emitting diode is generally composed.
Figure 2:
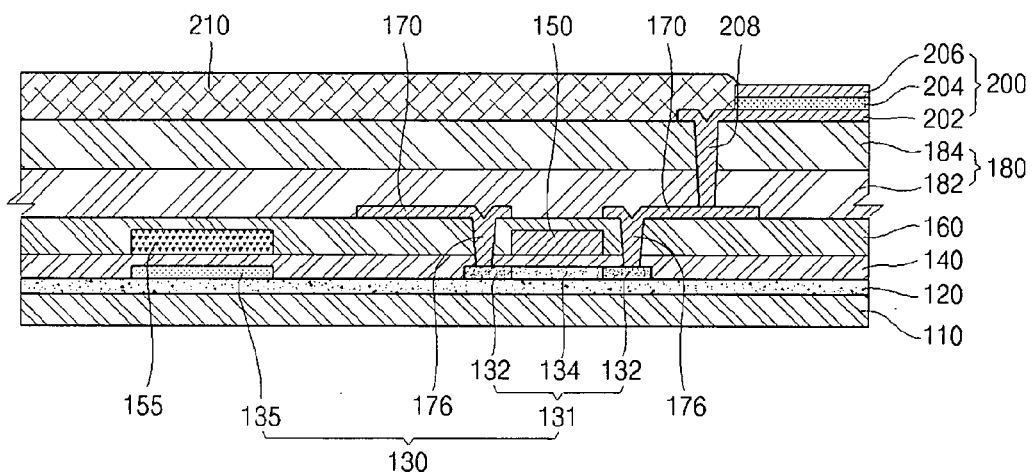
FIG. 2 is a sectional view of an organic light emitting display.

Referring to FIG. 2, a plan view of an organic light emitting display is shown.

As shown in FIG. 2, the organic light emitting display 100 may include a substrate 110, a buffer layer 120 formed on the substrate 110, an active layer 130 formed on the buffer layer 120, a gate insulating layer 140 formed on the active layer 130, a gate electrode 150 and a upper electrode of the capacitor 155 formed on the gate insulating layer 140, an interlayer dielectric layer 160 formed on the gate electrode 150 and the upper electrode of the capacitor 155, a source/drain electrode 170 formed on the interlayer dielectric layer, an insulating layer formed on the source/drain electrode 170, an organic light emitting diode 200 formed on the insulating layer 180, and a pixel definition layer 210 formed on the insulating layer 180.

The substrate 110 can be formed so that its upper side and lower side are parallel and the distance between the upper and lower plane is about 0.05~1 mm. In case that the thickness of the substrate 110 is less than 0.05 mm, it has disadvantages that it can easily be damaged by cleaning, etching, and heat treatment process during the fabricating process. In addition, it is vulnerable to external force. Furthermore, in case that the thickness of the substrate 110 is greater than 1 mm, it is difficult to assemble the substrate 110 into some displays which are very thin. Moreover, the substrate 110 can be made of one selected from among a glass substrate, a plastic substrate, a metal substrate, a polymer substrate, and an equivalent of them. However, the present invention is not limited to the material of the substrate.

The buffer layer 120 can be formed on the upper side of the substrate 110. The buffer layer 120 functions so that certain impurities, such as, $H_2O$, $H_2$, or $O_2$ do not penetrate the substrate 110 toward the organic light emitting diode 200 or a semiconductor layer 131 which will be described later. Consequently, the buffer layer 120 can be made of at least one selected from among a silicon oxide layer ($SiO_2$), a silicon nitride layer ($Si_3N_4$), an inorganic layer, and an equivalent of them. However, the material is not limited in the present invention. In some embodiments, buffer layer 120 can be omitted according to the structure of the substrate 110 or the active layer 130.

The active layer 130 includes a semiconductor layer 131 formed on the upper side of the buffer layer 120 and a lower electrode of the capacitor 135.

The semiconductor layer 131 can be formed on the upper side of the buffer layer 120. The semiconductor layer 131 may include a source/drain region 132 formed on both side which are symmetrical and a channel region 134 formed between the source/drain region 132.

The semiconductor layer 131 can be made of at least one selected from among amorphous silicon, poly silicon, organic thin film, micro silicon (whose grain size is between amorphous silicon and poly silicon) and an equivalent of them. However, the kind of the semiconductor layer 131 is not limited in the present invention.

In case that the semiconductor layer 131 is made of amorphous silicon, the semiconductor layer 131 can be formed by a method wherein crystallization is executed by a laser at low temperature, a method wherein crystallization is executed using metal catalyst, and an equivalant of them. However, the crystallization method of amorphous silicon is not limited to the present invention.

ELA (Excimer Layer Annealing), SLS (Sequential Lateral Solidification), and SPC(Solid Phase Crystallization) and so on are available as a crystallization method wherein a laser is used. However, the present invention is not limited to the methods.

MIC (Metal Induced Crystallization), MILC (Metal Induced Lateral Crystallization), SGS (Super Grained Silicon) and so on are available as a crystallization method wherein a metal catalyst is used. However, the present invention is not limited in method of crystallization.

The lower electrode of the capacitor 135 can be formed on the upper side of the buffer layer 120 just as the semiconductor layer 131 is. That is to say, the lower electrode of the capacitor 135 and the semiconductor layer 131 may exist on substantially the same plane. The lower electrode of the capacitor 135 forms an active layer along with the semiconductor layer 131.

The semiconductor layer 131 and the lower electrode of the capacitor 135 may coupled each other although it is not illustrated in FIG. 2. In some embodiments, the lower electrode of the capacitor 135 has a rectangular shape. In addition, the lower electrode of the capacitor 135 can be formed by the same process by which the semiconductor layer 131 is formed.

The lower electrode of the capacitor 135 can be formed at the bottom of any of a red pixel, a green pixel, and a blue pixel. In addition, a distinctive pattern (or distinctive shape) according to a RGB pixel respectively can be formed at the lower electrode of the capacitor 135. That is to say, the distinctive pattern can be formed on the lower electrode of the capacitor 135 of the active layer 130. Each pixel of a same type, such as red, may be given substantially the same distinctive pattern, where each pixel of other types are given distinctive patterns which are easily distinguished from the distinctive pattern given the red pixels by visual inspection. As a result, while looking at the array of pixels, pixels of each type are easily distinguished from one another. Types for categorizing pixels is not limited, and may include such distinguishing characteristics as color, column, row, or a combination of these or other characteristics. The distinctive pattern may be applied to displays using color schemes other than RGB or to black and white displays.

The location and the shape of the distinctive pattern is not limited, and some examples will be described later.

The gate insulating layer 140 can be formed on the semiconductor layer 131. The gate insulating layer 140 can also be formed on the buffer layer 120 which is an external circumference of the semiconductor layer 131. And, the gate insulating layer 140 can be made of at least one selected from among a silicon oxide layer, a silicon nitride layer, an inorganic layer, or an equivalent of them. However, the material of which the gate insulating layer 140 is made is not limited in the present invention.

The gate electrode 150 can be formed on the upper side of the gate insulating layer 140. More particularly, the gate electrode 150 can be formed on the gate insulating layer 140 which corresponds to the channel region 134 of the semiconductor layer 131. The gate electrode 150 forms a channel of a hole or an electron at the channel region 134 by applying a current to the channel region 134 at the bottom of the gate insulating layer 140. This structure is named FET (Field Effect Transistor), more particularly, MOSFET (Metal Oxide Silicon Field Effect Transistor). In addition, the gate electrode 150 can be made of metal (Mo, MoW, Ti, Cu, Al, AlNd, Cr, Mo alloy, Cu alloy, Al alloy, and so on), doped poly silicon, and an equivalent of them. However, the material of which the gate electrode 150 is made is not limited in the present invention.

The upper electrode of the capacitor 155 can be formed on the upper side of the gate insulating layer 140. The upper electrode of the capacitor 155 is coupled to the gate electrode 150 although it is not illustrated in FIG. 2. In addition, the upper electrode of the capacitor 155 can be made of at least one selected from among metal (Mo, MoW, Ti, Cu, Al, AlNd, Cr, Mo alloy, Cu alloy, Al alloy, and so on), doped poly silicon, and equivalent of them. However, the material of which the gate electrode 150 is made is not limited in the present invention. In some embodiments, the upper electrode of the capacitor is replaced by the anode electrode of the organic light emitting diode 200. That is to say, the fabricating process of the upper electrode of the capacitor 155 can be omitted in this case.

The interlayer dielectric layer 160 can be formed on the upper side of the gate insulating layer 140 and the gate electrode. The interlayer dielectric layer 150 can be made of one selected from among a silicon oxide layer, a silicon nitride layer, a polymer, plastic, glass, or an equivalent of them. However, the material of which the interlayer dielectric layer is made is not limited in the present invention.

An etching process is executed to bring a semiconductor region into contact with the source/drain region 143, which is called a contact hole process. The region exposed is called a contact hole, and a conductive contact 176 is formed at the contact hole.

The source/drain electrode 170 is formed at the upper side of the interlayer dielectric layer 160 by a method selected from among PECVD (Plasma Enhanced Chemical Vapor evaporation), LPCVD (Low Pressure Chemical Vapor evaporation), sputtering, and an equivalent of them. The source/drain electrode 170 is formed at desirable location through the process such as photoresist spread, exposure, development, etching, and photoresist strip. The conductive contact 176 penetrating the interlayer dielectric layer 160 is formed between the source/drain electrode 170 and the source/drain region 132 of the semiconductor layer 131. The conductive contact 176 is formed through the contact hole formed in advance as described above.

The semiconductor layer 131 and the source/drain electrode 170 are coupled each other through the conductive contact 176. The conductive contact 176 can be formed using the same material as the material of which the gate electrode 150 and the source/drain electrode 170 are made. However, the material of which the conductive contact 176 is made is not limited in the present invention.

The source/drain electrode 170 can be formed on the upper side of the interlayer dielectric layer 160. The conductive contact 176 penetrating the interlayer dielectric layer 160 can be formed between the source/drain electrode 170 and the semiconductor layer 131. That is to say, the source/drain region 132 and the source/drain electrode 170 of the semiconductor layer 131 are coupled each other through the conductive contact 176. Furthermore, the source/drain electrode 170 can be made of the same material as the material of which the gate electrode 150 is made. However, the material of which the source/drain electrode 170 is made is not limited in the present invention.

The insulating layer 180 can be formed on the upper side of the interlayer dielectric layer 160 and the source/drain electrode 170. The insulating layer 180 may include a protection layer 182, a planarization layer 184 formed on the upper side of the protection layer 182.

The protection layer 182 covers the source/drain layer 170 and the interlayer dielectric layer 160 and protects the source/drain electrode 170 and so on. A via hole is formed in advance by etching the region which corresponds to the source/drain electrode 170 at the protection layer 182 and the planarization layer 184. A conductive via 208 is formed at the via hole. The conductive via 208 couples the anode 202 of the organic light emitting diode 200 and the source/drain region 132 of the semiconductor layer 131. The protection layer 182 can be made of one selected from among a general inorganic layer and its equivalent. However, the material of which the protection layer 182 is made is not limited in the present invention.

The planarization layer 184 is formed on the protection layer 182. The planarization layer 184 prevents the organic light emitting diode and its cathode from being disconnected or short-circuited due to level difference. The planarization layer 184 can be made of at least one selected from among BCB (Benzo Cyclo Butene), acrylic, and an equivalent of them. However, the material of which the planarization layer 184 is made is not limited in the present invention.

The organic light emitting diode 200 can be formed at the external circumference of the pixel definition layer 210. The organic light emitting diode 200 may include an anode 202, an organic thin film 204 formed on the upper side of the anode, and a cathode 206 formed on the upper side of the organic thin film 204.

The anode 202 can be made of at least one selected from among ITO (Indium Tin Oxide), ITO/Ag, ITO/Ag/ITO, ITO/Ag/IZO (Indium Zinc Oxide), Ag alloy (ITO/Ag alloy/ITO), and an equivalent of them. However, the material of which the anode 202 is made is not limited in the present invention. The ITO is a transparent conductive layer which has a low hole injection barrier toward the organic thin film 204 due to its uniform work function. The Ag is a layer which reflects light which especially comes from the organic thin film 204 in the top emission type.

The anode 202 can be formed at the bottom which corresponds a red pixel, a green pixel, and a blue pixel just as the lower electrode of the capacitor 135. In addition, a distinctive pattern of a different shape according to a RGB pixel respectively can be formed at the anode 202.

The location and the shape of the distinctive pattern will be described with the description of another embodiment.

The organic thin film 204 may include an emitting layer (EML) which forms an exciton and emits light, an electron transport layer (ETL) which controls the velocity of an electron appropriately, and a hole transport layer (HTL) which controls the velocity of a hole appropriately.

And, an electron injecting layer (EIL) which enhances the electron injecting efficiency is formed at the electron transport layer. Moreover, a hole injecting layer (HIL) which enhances the hole injecting efficiency can also be formed at the hole transport layer.

In addition, the cathode 206 can be one selected from among Al, MgAg alloy, MgCa alloy, and an equivalent of them. However, the material of which the cathode 206 is made is not limited in the present invention. If the top emission is selected, the Al should be very thin. However, the resistance increases in that case, thus it has a disadvantage that electron injection barrier becomes greater. The MgAg alloy has a smaller electron injection barrier as the Al, and the MgCa alloy has a smaller electron injection barrier as the MgAg alloy. Consequently, in case of the top emission, MgAg alloy and MgCa alloy are preferably used as the cathode 206 instead of the Al. However, the MgAg alloy and MgCa alloy can form an insulating layer because they can be oxidized as they are sensitive to the environment, thus they should be isolated from the exterior completely.

The pixel definition layer 210 is the external circumference of the organic light emitting diode 200, and it can be formed on the upper side of the insulating layer 180. The pixel definition layer 210 clarifies the boundary between a red organic light emitting diode, a green organic light emitting diode, and a blue organic light emitting diode so that the boundary region of emission between pixels can be clarified. And, the pixel definition layer 210 can be made of at least one selected from among polyimide and its equivalent. However, the material of which the pixel definition layer 210 is made is not limited in the present invention.

Although one thin film transistor, one capacitor, and one organic light emitting diode are illustrated in FIG. 2, they are merely illustrative embodiments. Various modifications can be made. For example, the number of thin film transistors and capacitors can vary according to the kind of the pixel circuit in the organic light emitting display. In addition, the upper electrode of the capacitor 155 is illustrated separately in FIG. 2. However, the anode can be used as the upper electrode of the capacitor 155 according to some embodiments, and additional description will be omitted as those skilled in the art can easily modify the illustrated embodiments.

Hereinafter, a pixel circuit of a general organic light emitting display will be described.

Figure 3:
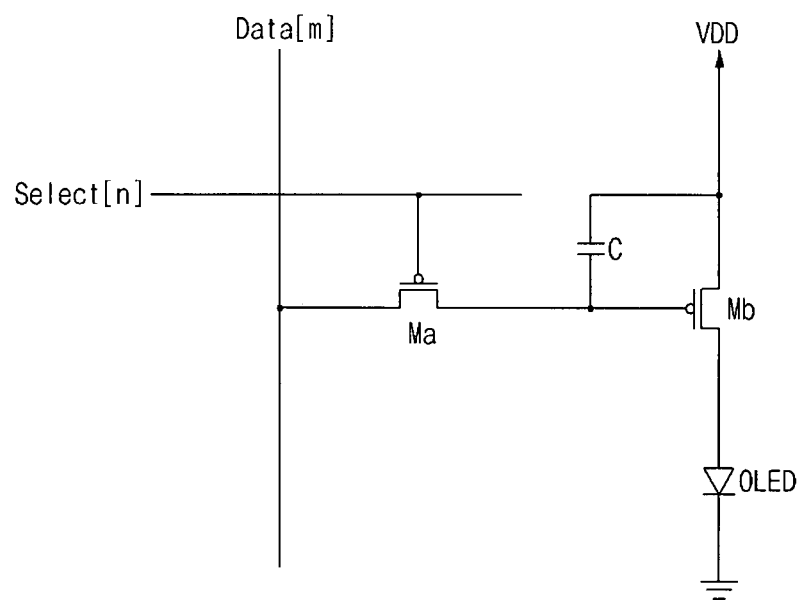
FIG. 3 is a schematic view of a pixel circuit of a general organic light emitting display.

A pixel circuit of an organic light emitting display used in general is described in FIG. 3.

Referring to the circuit diagram of a pixel circuit in FIG. 3, a pixel circuit includes a switching transistor (Ma), a driving transistor (Mb), a capacitor (C), and an organic light emitting diode (OLED).

A control electrode (a gate electrode) of the switching transistor (Ma) is coupled to a scan line, and a first electrode (source or drain electrode) of the switching transistor (Ma) is coupled to a data line. And, a second electrode of the switching transistor (Ma) is coupled to the control electrode of the driving transistor (Mb). Consequently, once a scan signal is input into the control electrode of the switching transistor (Ma) through the scan line, the switching transistor (Ma) is turned on. Thus, a current flows through the driving transistor (Mb).

A control electrode of the driving transistor (Mb) is connected to the switching transistor (Ma). And, a first electrode of the driving transistor (Mb) is connected to a power source (VDD), and a second electrode of the driving transistor (Ma) is coupled to the organic light emitting diode (OLED). Accordingly, once the driving transistor (Mb) is turned on, a current flows through the organic light emitting diode (OLED), thus light is generated.

A first electrode of the capacitor (C) is coupled to the second electrode of the switching transistor (Ma) and the control electrode of the driving transistor (Mb). And, a second electrode of the capacitor (C) is coupled to the first electrode of the power source (VDD) and the first electrode of the driving transistor (Mb). That is to say, the capacitor (C) is coupled between the control electrode and the first electrode of the driving transistor (Mb). Accordingly, once a data value is applied as the switching transistor (Ma) is turned on, the data value is stored in the capacitor (C).

$$I_{OLED} = \frac{1}{2}\beta(V_{GS} - V_{TH})^2$$

Consequently, light is generated as the current of the value of above equation flows through the organic light emitting diode (OLED) by the voltage of the capacitor (C). In the equation, the $\beta$ denotes $\mu_n C_{OX}$, and $\mu_n$ denotes electron mobility. In addition, Cox denotes the capacitance of the $SiO_2$ layer of the driving transistor (Mb). Moreover, $V_{GS}$ denotes the voltage difference between the control electrode and the first electrode of the driving transistor (Mb), and $V_{TH}$ denotes the threshold voltage of the driving transistor (Mb).

Hereinafter, an organic light emitting display according to one embodiment will be described.

Figure 4:
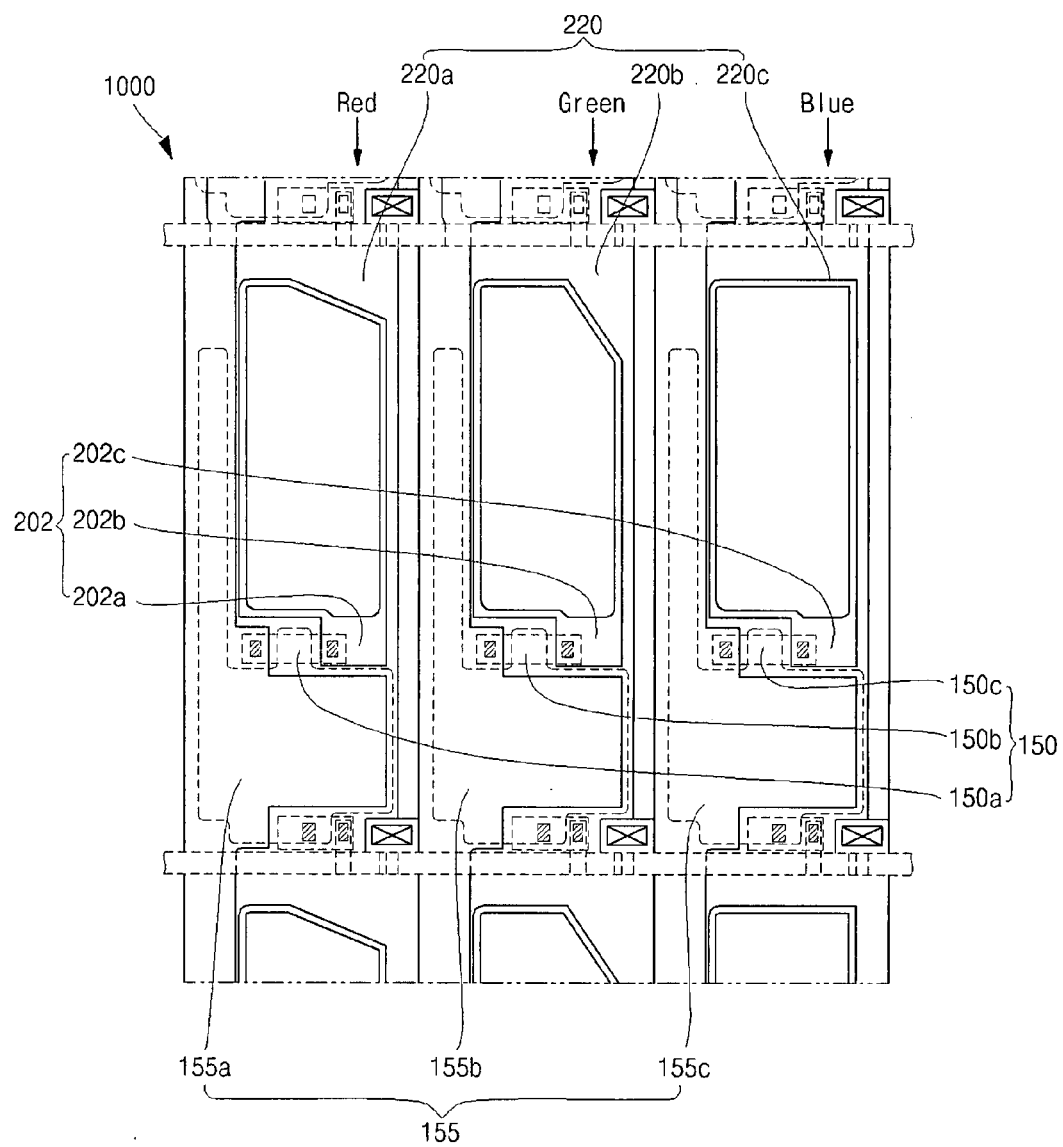
FIG. 4 is a plan view of an organic light emitting display according to an embodiment.

A plan view of an organic light emitting display 1000 according to an embodiment is illustrated in FIG. 4.

As shown in FIG. 4, the organic light emitting display 1000 includes an anode 202 at which a different distinctive patterns 220 are formed for each RGB pixel respectively. In this view, the distinctive patterns 220 are formed at the right upper part of the anode 202.

An anode 202a for a red pixel is equipped with a right triangular shaped distinctive pattern 220a at the right upper part. In addition, an anode 202b corresponding to a green pixel is equipped with a right triangular shaped distinctive pattern 220b at the right upper part as well. The right triangle which is a shape of the distinctive pattern 220a and 220b has 2 remaining edges other than the hypotenuse. In case that the longer edge of the two edges is formed at the upper part of the anode, it is the characteristic of the distinctive pattern 220a of the anode 202a which corresponds to a red pixel. On the contrary, in case that the shorter edge is formed at the upper part of the anode, it is the characteristic of the distinctive pattern 220b of the anode 202b which corresponds to a green pixel. Meanwhile, an anode 202c corresponding to a blue pixel has a distinctive pattern which has no triangular shape.

The anode of the pixels is equipped with a different distinctive pattern according to a RGB pixel respectively. Consequently, a cause of a defect can be determined rapidly during a lighting test. The analyzing process of the lighting test using the organic light emitting display will be described later.

The distinctive patterns 220 do not need to be triangular shaped. The patterns can be any shape. For example, the shape may be selected from among a tetragonal shape, a pentagonal shape, an irregular shape, a semicircular shape, and a combination of them. In some embodiments, the shape may be that of a letter corresponding to the type of the pixel. For example, a red pixel may have an "R" formed therein. In addition, the shapes do not need to be formed at the right upper part of the anode. The distinctive patterns 220 can be formed at any side, multiple sides, and/or in a central portion of the anode 202. That is to say, the location and the shape of the distinctive pattern 220 of the present invention is not limited to the right triangular shape formed at the right upper part of the anode 202. Distinctive patterns 220 of any shape can be formed at any location.

The distinctive patterns 220 may be alternatively or additionally formed in the lower electrode of the capacitor 135

Hereinafter, the organic light emitting display 1000 according to an embodiment will be described.

Referring to FIG. 5a to 5e, a drawing which depicts distinctive patterns 220 of differing shapes for the pixels respectively formed at the anode 202 and the distinctive pattern 221 of the anode 202 are illustrated in the organic light emitting display 1000 according to an embodiment.

Figure 5A:
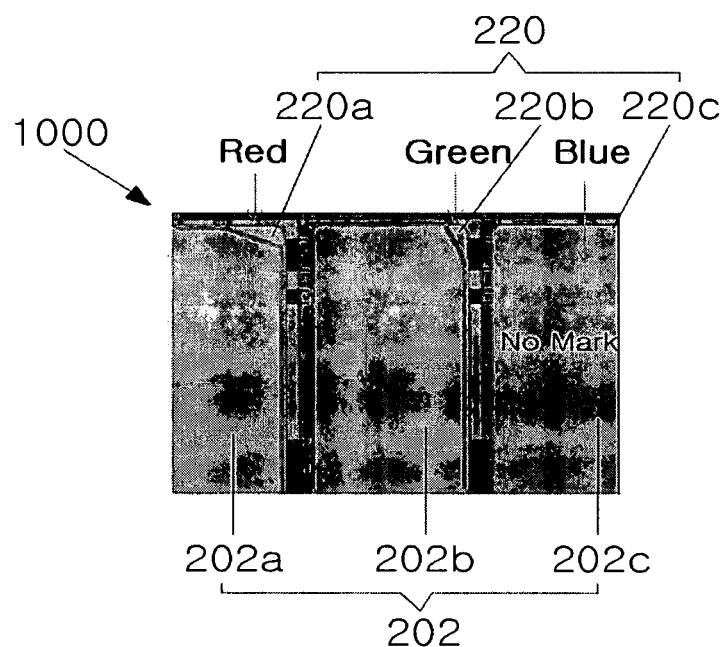
FIG. 5a to 5e are images of an anode of an organic light emitting display according to an embodiment, where the anode has a distinctive pattern.

As shown in FIG. 5a, enlarged images of an anode 202a for a red pixel, an anode 202b for a green pixel, and an anode 202c for a blue pixel are illustrated. As described above, RGB can be distinguished as a distinctive patterns 220 are formed at each anode (202) for a red pixel, anode for a green pixel, and anode for a blue pixel.

As shown in FIG. 5a, the anode 202 is a generally rectangular shape. The distinctive pattern 220a is formed at the right upper part of the anode 202a for a red pixel, and the distinctive pattern 220b is formed at the right upper part of the anode 202b for a green pixel. In the case of the anode 202c for a blue pixel, the distinctive pattern 220c is not formed. If a RGB pixel can be distinguished, the distinctive pattern 220 can be formed at any location of the anode 202.

In addition, as shown in FIG. 5a, the right triangular shaped distinctive pattern 220a with a long base line is formed at the right upper part of the anode 202a for a red pixel toward the upper part of the anode 202a. The right triangular shaped distinctive pattern 202b with a long base line is formed at the right upper part of the anode 202b for a green pixel toward the right side of the anode. The distinctive pattern 220c with no special shape is formed at the anode 202c for a blue pixel. The shape of the distinctive patterns 220 are to distinguish the RGB pixels from one another. In addition, the shape of the distinctive pattern can be, for example, triangular, tetragonal, pentagonal, and semicircular.

Figure 5B:
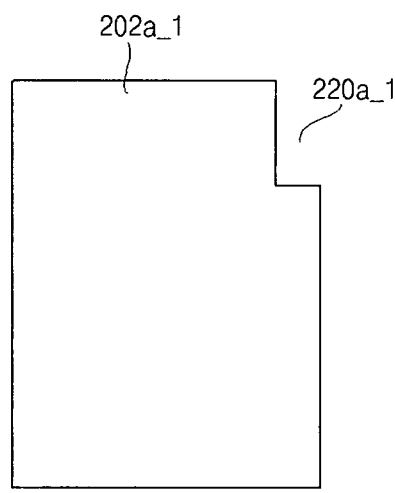
Figure 5C:
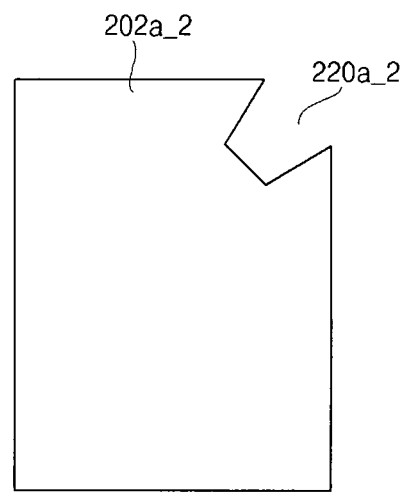
Figure 5D:
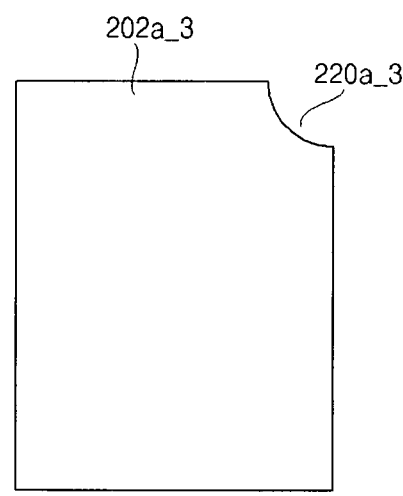
Figure 5E:
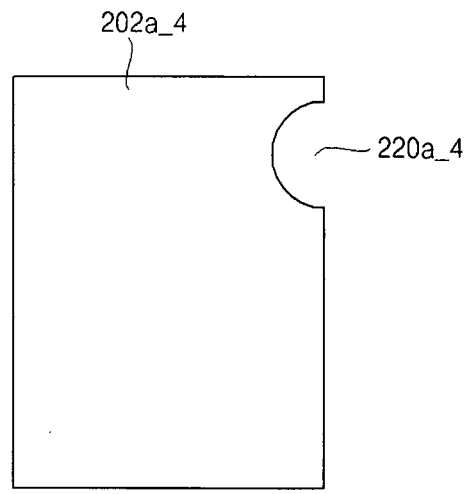

Another distinctive pattern 220a_1 of the anode 202a_1 for a pixel is illustrated in FIG. 5b to 5e. In FIG. 5b, a tetragonal shaped distinctive pattern 220a_1 formed at an anode 202a_1 for a pixel is illustrated. In FIG. 5c, a pentagonal distinctive pattern 220a_2 formed at an anode 202a_2 for a pixel is illustrated. In FIG. 5d, a portion of a circle shaped distinctive pattern 220a_3 formed at an anode 202a_3 for a pixel is illustrated. In FIG. 5c, another portion of a circle shaped distinctive pattern 220a_4 formed at an anode 202a_4 for a pixel is illustrated.

The distinctive patterns shown in FIG. 5b to 5e as representative examples. However, a distinctive patterns for the various anodes may include any of these shapes and other shapes. In some embodiments, the distinctive shape of a red anode is one type of shape such as triangular, and the distinctive shape of a nearby green anode is of another type of shape, such as circular.

However, the location and the shape of the distinctive pattern 220 formed at the anode 220 is not limited to the present invention. And, the distinctive pattern 202a, 202b, and 202c of the RGB pixel can be formed in various shapes at various locations of the anode 202a, 202b, and 202c.

Hereinafter, an organic light emitting diodes display 2000 according to another embodiment will be described.

Referring to FIG. 6a to 6d, a drawing which depicts a distinctive pattern 221 of a different shape formed at the lower electrode of the capacitor 135 and the distinctive pattern 221 of the lower electrode of the capacitor 135 are illustrated.

Figure 6A:
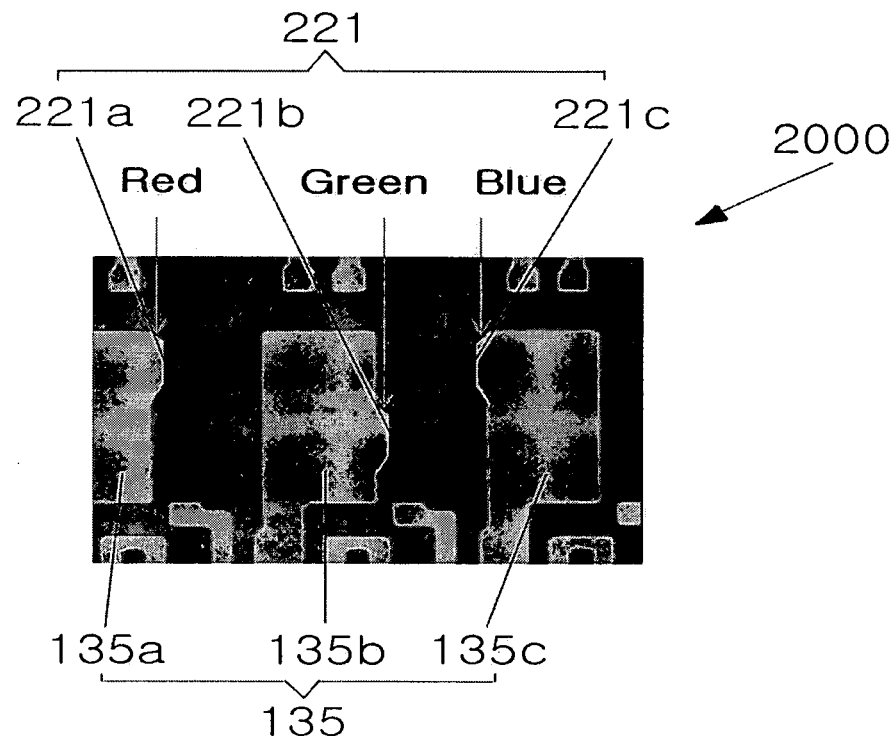
FIG. 6a to 6d are images of a lower electrode of the capacitor of an organic light emitting display according to another embodiment, where the lower electrode has a distinctive pattern.

As shown in FIG. 6a, enlarged images of a lower electrode of the capacitor 135a for a red pixel, a lower electrode of the capacitor 135b for a green pixel, and a lower electrode of the capacitor 135c for a blue pixel are illustrated. As described above, a pixel can be distinguished with a distinctive pattern 221 formed at each lower electrode of the capacitor 135a for a red pixel, lower electrode of the capacitor 135b for a green pixel, and lower electrode of the capacitor 135c for a blue pixel The lower electrode of the capacitor 135 is formed in a generally rectangular shape in FIG. 6a. A distinctive pattern 221a is formed at the right upper part 501 of the lower electrode of the capacitor 135a for a red pixel. A distinctive pattern 221b is formed at the right lower part 502 of the lower electrode of the capacitor 135b for a blue pixel. A distinctive pattern 221c is formed at the left upper part 503 of the lower electrode of the capacitor 135c for a blue pixel. In addition, the distinctive patterns 221 can be formed at any location of the rectangle of the lower electrode of the capacitor.

In addition, a particular shaped distinctive pattern 221 is formed in FIG. 6a. However, the distinctive pattern 221 can be formed in any shape, such as a triangular shape, a rectangular shape, a pentagonal shape, and a semicircular shape. According to circumstances, the distinctive pattern 221 can be formed in a different shape for every pixel.

Figure 6B:
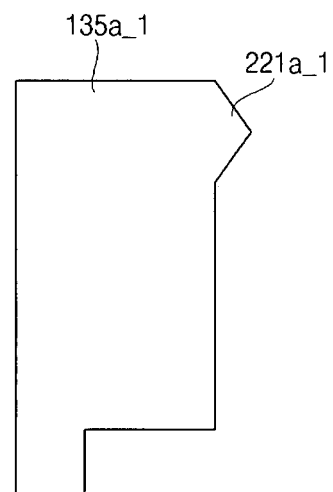
Figure 6C:
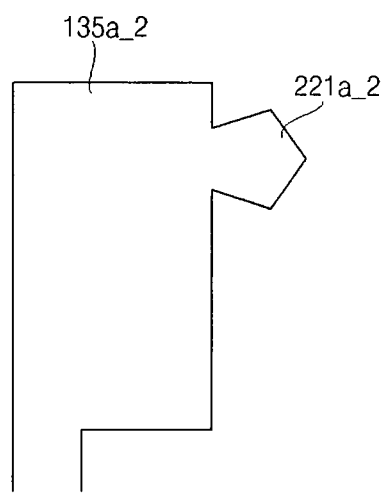
Figure 6D:
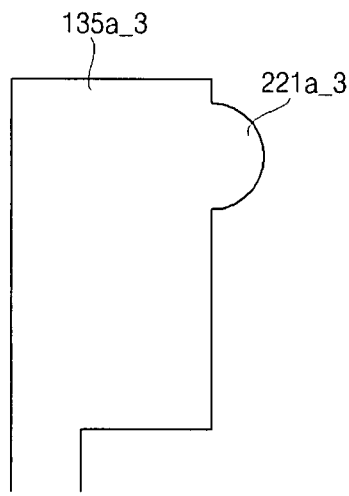

A distinctive pattern 221 of a lower electrode of the capacitor 135a for a red pixel is illustrated as a representative of the distinctive pattern 221 of the lower electrode of the capacitor in FIG. 6b to 6d. In FIG. 6b, a triangular shaped distinctive pattern 221a_1 is formed at the right upper part of the lower electrode of the capacitor 135a_1 for a red pixel. In FIG. 6c, a pentagonal shaped distinctive pattern 221b_2 for a red pixel is formed at the lower electrode of the capacitor 135a_2 for a red pixel. In FIG. 6d, a semicircular shaped distinctive pattern 221a_3 is formed at the lower electrode of the capacitor 135a_3 for a red pixel.

In FIG. 6b to 6d, the distinctive pattern 221a on the lower electrode of the capacitor 135a for a red pixel is described as a representative. However, a distinctive pattern 221b and 221c on a lower electrode of the capacitor 135b and 135c for a different color can be formed in the same shape or in a different shape.

However, if the distinctive pattern is formed in a shape so that it can be determined that to which pixel from among RGB the lower electrode of the capacitor 135a, 135b, and 135c correspond, the distinctive pattern 221a, 221b, and 221c can be formed in any shape at any location of the lower electrode of the capacitor 135a, 135b, and 135c. And, the location and the shape of the distinctive pattern 221a, 221b, and 221c are not limited.

Hereinafter, an analyzing process of the cause of a pixel defect will be described according to the organic light emitting display 1000.

What will be described hereinafter is merely an example to describe the analyzing process of the cause of a pixel defect found during a lighting test.

Referring to FIG. 7a to 7d, an image is shown, in which the cause of a pixel defect found in a green lighting test is being analyzed.

Figure 7A:
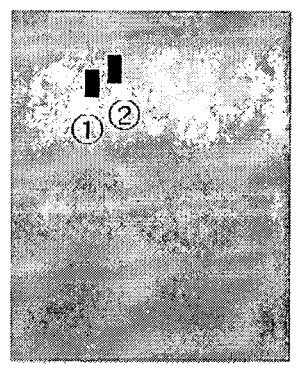
FIG. 7a to 7d are images illustrating a cause of a pixel defect detected during a green lighting test.

FIG. 7a is an image of a green lighting test, and two dark defects are shown.

Accordingly, the cause of the defects is analyzed, and the region of expected cause of the defects is shown.

Figure 7B:
Figure 7C:
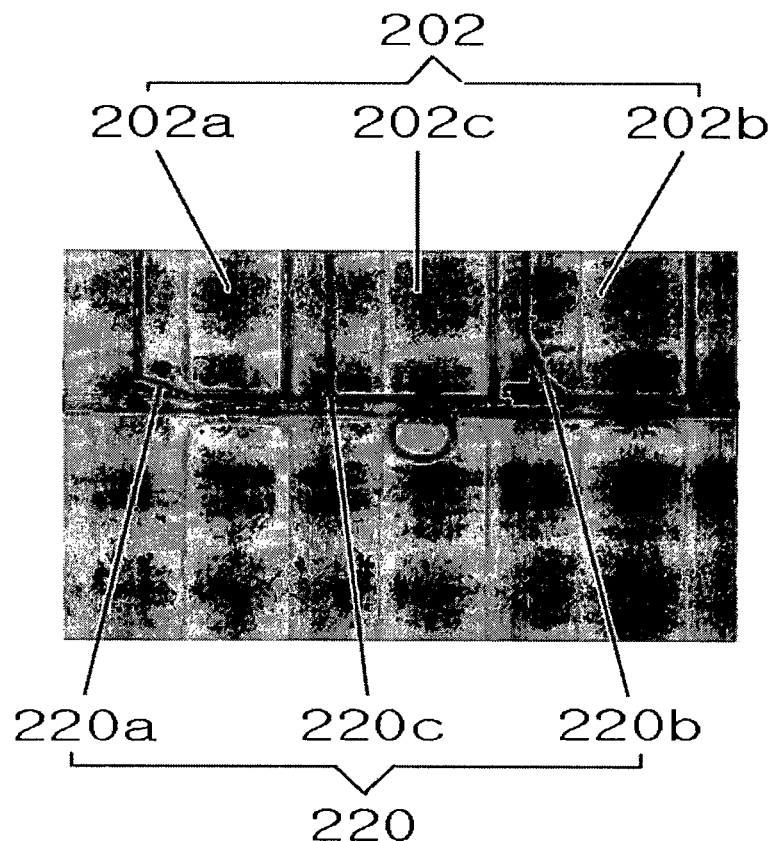
Figure 7D:
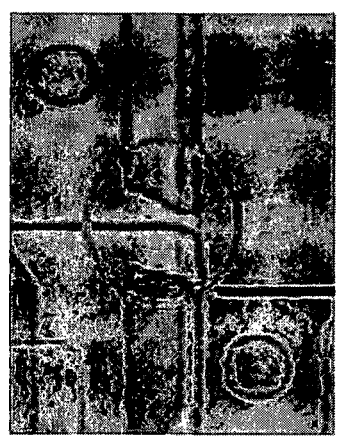

FIGS. 7c and 7d are an enlarged image of the dark defects of FIG. 7b. FIG. 7c is an image of source/drain test process. Accordingly, it can be determined that one dark defect is caused by a short circuit as FIG. 7c is examined. FIG. 7d is an image wherein a small particle is found as a result of microscopic examination.

In the case of the traditional pixel circuit in which the RGB pattern is the same, it is difficult to determine if the particle is the cause of the dark defect or not.

However, when the pixel has distinctive patterns, the RGB pattern is distinguished easily. Accordingly, referring to FIG. 7d, it can be determined that the particle exists on a blue pixel because of the distinctive patterns 220. That is to say, one of the two defects found from the test image of the green lighting test is not caused by the particle but caused by another problem.

As describe above, in the organic light emitting display 1000, it can be determined rapidly from which pixel from among RGB the cause of a defect found during lighting test is generated.

Hereinafter, an analyzing process of the cause of a pixel defect will be described according to the organic light emitting display.

What will be described hereinafter is merely an example to describe the analyzing process of the cause of a pixel defect found during a lighting test.

Figure 8A:
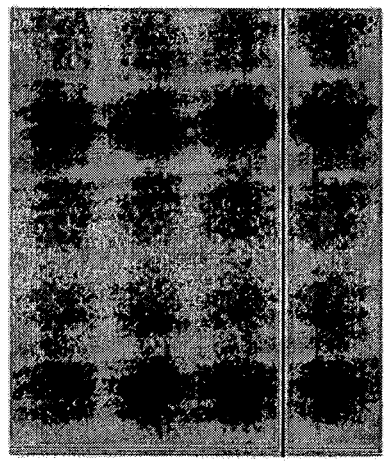
FIG. 8a to 8c are images illustrating a pixel defect detected during a red lighting test.
Figure 8B:
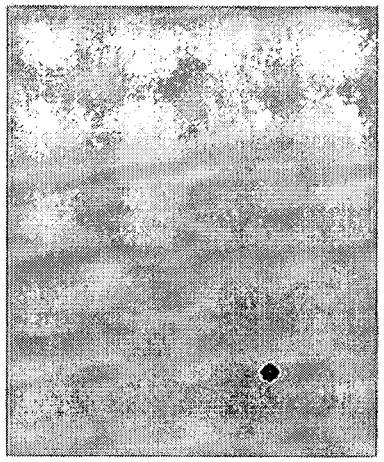
Figure 8C:
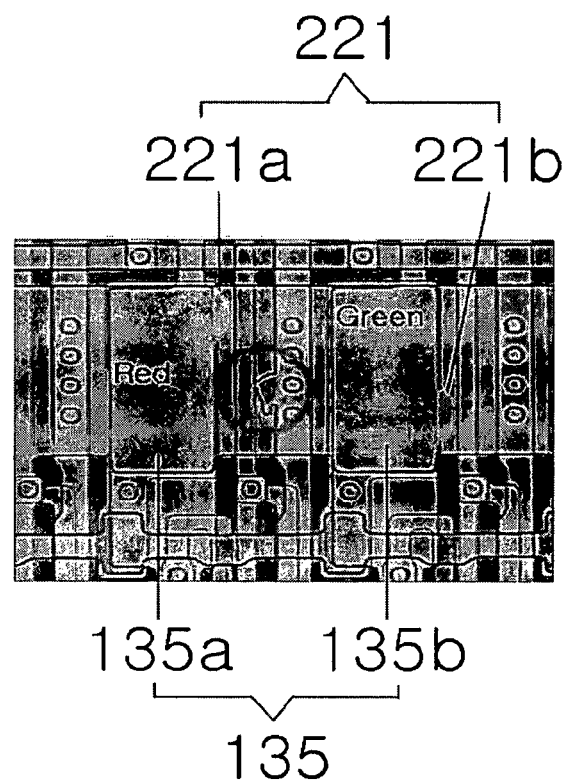

Referring to FIG. 8a to 8c, an image is shown, in which the cause of a pixel defect found in a red lighting test is being analyzed.

FIG. 8a is an image of a red lighting test. As shown in FIG. 8a, a vertical dark line is shown. That is to say, a vertical a pixel defect is generated.

Accordingly, the cause of the defects is analyzed, and the region of expected cause of the defect is found just as it is in the image of FIG. 8b. FIG. 8c is an enlarged image of FIG. 8b. However, it cannot be concluded if the expected cause is the cause of the vertical dark defect found during the red lighting test. Generally, a vertical dark defect can happen when a data line and a first power source line are connected inappropriately. However, it cannot be clarified if there is an inadequate connection only with the image of FIG. 8b.

However, as shown in FIG. 8c, in case that the distinctive pattern 221b is formed at the lower electrode of the capacitor 135 for a green pixel, it can be guessed that the expected region of the defect is a region related to a green pixel.

Consequently, during the fabricating process of the organic light emitting display, it can be easily found out that the cause of the vertical dark defect found during the red lighting test is unrelated to the inappropriate connection 221b shown in FIG. 8c.

As describe above, in the organic light emitting display 2000, it can be determined rapidly from which pixel of RGB the cause of a defect found during lighting test is generated by forming the distinctive pattern 221 by which RGB pixels can be distinguished from one another by distinctive patterns in the lower electrodes of the capacitors 135.

Hereinafter, a fabricating process of an organic light emitting display according to the present invention will be described.

Referring to FIG. 9a to 9m, the fabricating process of the organic light emitting display according to the present invention is illustrated as plan views.

Figure 9A:
FIG. 9a to 9m are drawings describing the manufacturing process for a stack structure of an organic light emitting display according to an embodiment.

As shown in FIG. 9a, during the substrate preparing step, the substrate 110 which has flat upper and lower side and uniform thickness is provided.

The substrate 110 can be prepared with one selected from among glass, plastic, stainless steel, nano complex, and an equivalent of them. However, the material of which the substrate 110 is made is not limited in the present invention. In addition, the substrate preferably is about 0.05~1 mm thick.

In case that the thickness of the substrate 110 is thinner than 0.05 mm, it can be easily damaged during cleaning, etching, and heat treatment during the fabricating process. In addition, it has a disadvantage that it is difficult to handle, and it can be easily damaged by external force. Furthermore, in case that the substrate is thicker than 1 mm, it cannot be applied easily to various displays which are very thin.

Figure 9B:

As shown in FIG. 9b, during the buffer layer forming step, the buffer layer 120 of a uniform thickness is formed on the substrate 110. The buffer layer 120 functions so that water, hydrogen, or oxygen does not penetrate the semiconductor layer 131 or the organic light emitting diode 200 through the substrate 110. Of course, the buffer layer 120 helps the semiconductor layer 131 to be formed appropriately on the surface. The buffer layer 120 can be made of, for example, one selected from among a silicon oxide layer, a silicon nitride layer, an inorganic layer, and an equivalent of them. However, the material of which the buffer layer 120 is made is not limited in the present invention. Furthermore, the buffer layer 120 can be omitted according to the structure of the substrate 110 and active layer 130.

Figure 9C:
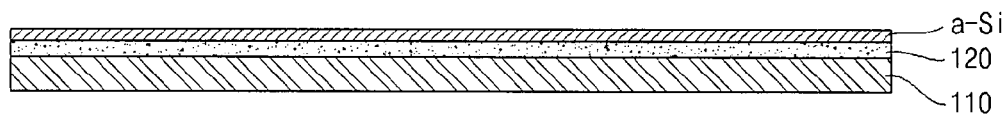

As shown in FIG. 9c, during the amorphous silicon evaporating step, amorphous silicon of an uniform thickness is evaporated on the upper side of the buffer layer 120.

For instance, the amorphous silicon can be formed, for example, by one method selected from among PECVD (Plasma Enhanced Chemical Vapor evaporation), LPCVD (Low Pressure Chemical Vapor evaporation, sputtering, and ah equivalent of them. The method by which the amorphous silicon is formed is not limited to the present invention.

Figure 9D:
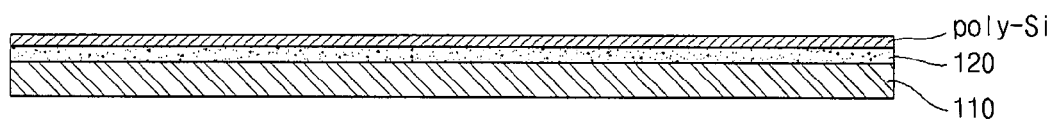

As shown in FIG. 9d, during the crystallization step, the amorphous silicon evaporated on the upper side of the buffer layer 120 is crystallized into poly silicon.

The semiconductor layer 131 can be formed by, for example, a method wherein crystallization is executed by laser at low temperature, a method wherein crystallization is executed with metal catalyst, and an equivalent of them. However, the crystallization method of amorphous silicon is not limited in the present invention. ELA (Excimer Layer Annealing), SLS (Sequential Lateral Solidification), and SPC (Solid Phase Crystallization) and so on are available as a crystallization method wherein the laser is used. However, the present invention is not limited to a particular method. In addition, MIC (Metal Induced Crystallization), MILC (Metal Induced Lateral Crystallization), SGS (Super Grained Silicon) and so on are available as a crystallization method wherein the metal catalyst is used. However, the present invention is not limited to certain methods.

Figure 9E:
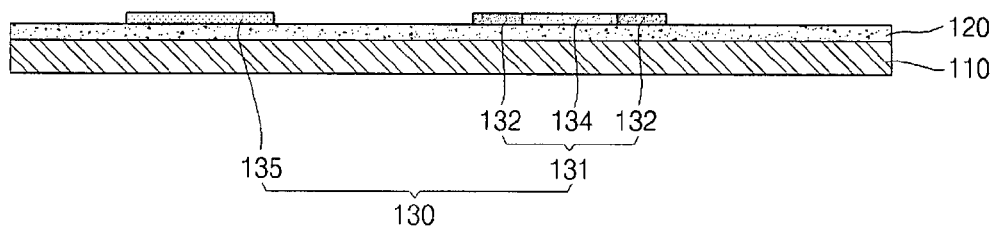

As shown in FIG. 9e, during the active layer forming step, the active layer (semiconductor layer and the lower electrode of the capacitor) is formed.

The semiconductor layer 131 and the lower electrode of the capacitor 135 is formed by etching the part of the crystallized poly silicon layer except for the semiconductor layer and the lower electrode of the capacitor 135. However, the present invention is not limited to this etching method.

In addition, the semiconductor layer 131 may include the channel region 134 and the source/drain region formed at both side of the channel region 134. The semiconductor layer 131 can be used as a thin film transistor. The thin film transistor can be at least one selected from among PMOS, NMOS, and an equivalent of them. However, the conducting type of the thin film transistor is not limited in the present invention.

During the active layer forming step, the lower electrode of the capacitor 135 can be formed. The lower electrode of the capacitor 135 can be formed in the same method as the semiconductor layer 131 is formed.

In addition, when the lower electrode of the capacitor 135 is formed, a different distinctive pattern 221 can be formed at each lower electrode of the capacitor for a red pixel, a green pixel, and a blue pixel.

The location and shape of the distinctive pattern 221 is not limited if a RGB pixel can be distinguished as described above. In addition, the distinctive pattern 221 can be formed by using the mask formed by distinguishing each RGB pixel during etching process.

Consequently, it can be easily determined if the lower electrode of the capacitor is at the pixel region of RGB pixel or not with the shape of the lower electrode of the capacitor 135.

Figure 9F:
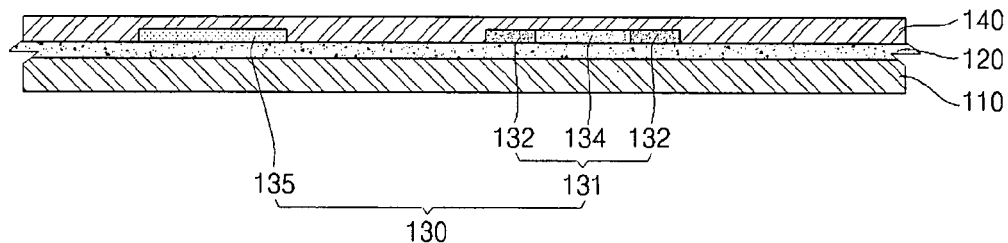

As shown in FIG. 9f, during the step of forming a gate insulating layer, the gate insulating layer 140 is formed. The gate insulating layer 140 can be formed on the upper side of the semiconductor layer 131 and the lower electrode of the capacitor 135. Of course, the gate insulating layer 140 can also be formed on the upper side of the buffer layer 120 which is the external circumference of the semiconductor layer 131 and the lower electrode of the capacitor 135. In addition, the gate insulating layer 140 can be formed with at least one selected from among a silicon oxide layer, a silicon nitrate layer, an inorganic layer, or an equivalent of them, which can be obtained during the semiconductor process. However, the material of which the gate insulating layer 140 is made is not limited to the present invention.

Figure 9G:
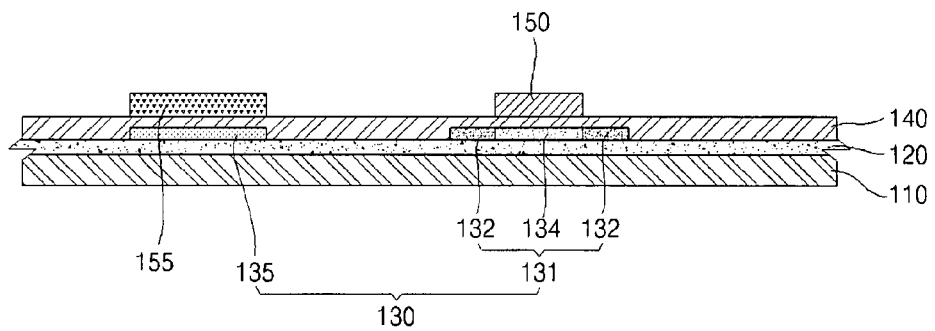

As shown in FIG. 9g, during the step of forming the gate electrode and the upper electrode of the capacitor, the gate electrode 150 and the upper electrode 155 can be formed. The gate electrode 150 and the upper electrode of the capacitor 155 can be formed on the upper side of the gate insulating layer 140. More particularly, the gate electrode 150 can be formed on the upper side of the gate insulating layer 140 which corresponds to the channel region 134 of the semiconductor layer 131. Furthermore, the upper electrode of the capacitor 155 can be formed on the upper side of the gate insulating layer 140 which corresponds to the lower electrode of the capacitor 135. As described above, the gate electrode 150 forms a channel of a hole or an electron at the channel region 134 by applying an electric current through the lower channel region 134 of the gate insulating layer 140.

In addition, the upper electrode of the capacitor 155 functions as a capacitor which is a storage capacitor in the organic light emitting display along with the lower electrode of the capacitor 135. Furthermore, the upper electrode of the capacitor 155 stores a data voltage during one frame and has a electric current corresponding the data voltage flow through the organic light emitting diode uniformly during emission period.

In addition, the gate electrode 150 and the upper electrode of the capacitor 155 can be made of, for example, one selected from among metal (Mo, MoW, Ti, Cu, Al, AlNd, Cr, Mo alloy, Cu alloy, Al alloy), doped poly silicon, and an equivalent of them. However, the material of which the gate electrode 150 and the upper electrode of the capacitor 155 are made is not limited in the present invention.

Moreover, the upper electrode of the capacitor 155 can be replaced with the anode 202 of the organic light emitting diode according to circumstances. The upper electrode of the capacitor forming step can be omitted in that case.

Figure 9H:
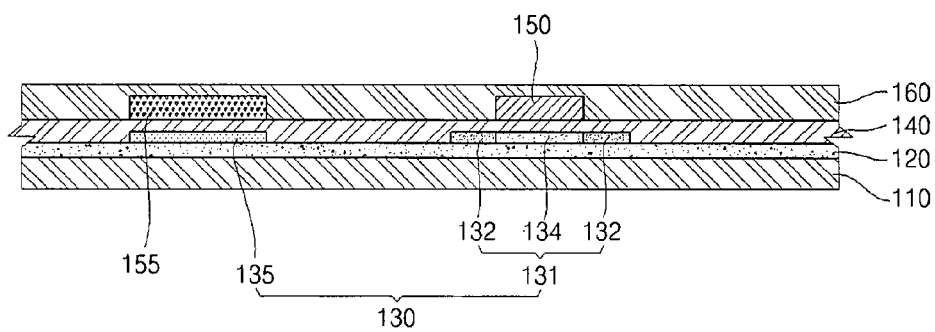

As shown in FIG. 9h, during the step of forming the interlayer dielectric layer, the interlayer dielectric layer 150 can be formed on the upper side of the gate electrode 150 and the upper electrode of the capacitor 155. Of course, the interlayer dielectric layer 160 can also be formed on the upper side of the gate insulating layer 140 which is the external circumference of the gate electrode 150 and the upper electrode of the capacitor 155. In addition, the interlayer dielectric layer 160 can, for example, be made of one selected from among polymer, plastic, glass, and equivalent of them. However, the material of which the interlayer dielectric layer 160 is made is not limited in the present invention.

Figure 9I:
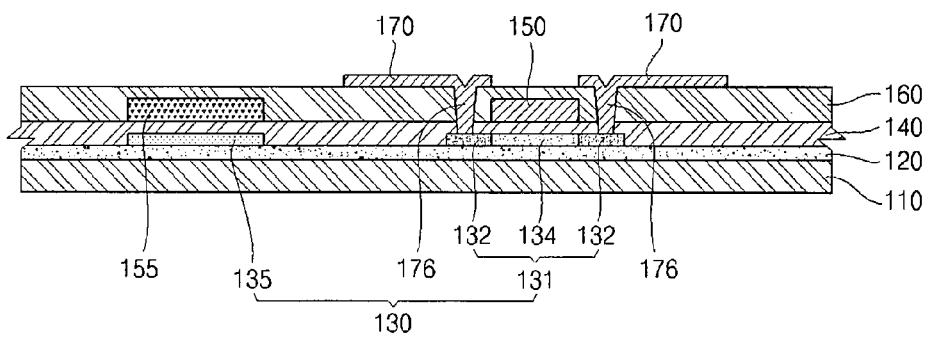

As shown in FIG. 9i, the step of forming of the source/drain electrode is a step during which source/drain electrode 170 is formed on the interlayer dielectric layer 160. More particularly, a contact 176 is formed after the interlayer dielectric layer 160 is formed. In addition, the source/drain electrode 170 is formed so that it is coupled to the source/drain region 132 of the active layer 130, and then it undergoes patterning process.

Figure 9J:
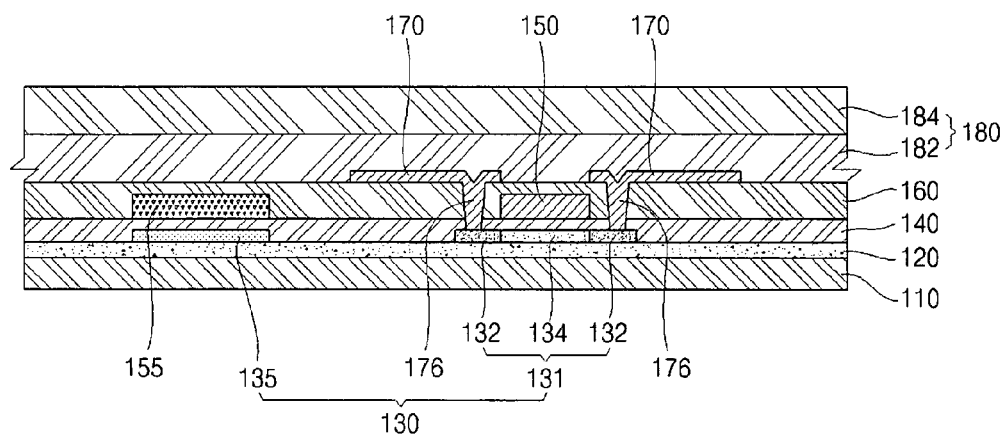

Subsequently, the insulating layer 180 is formed on the interlayer dielectric layer 160 and source/drain electrode 170 as shown in FIG. 9j. The insulating region may include the protection layer 182 and the planarization layer 184. The protection layer 182 can be formed, for example, by evaporating or coating at least one selected from among an inorganic layer and its equivalent. The planarization layer 184 levels the surface of the diode, and it can be formed, for example, by coating or evaporating at least one selected from among BCB (Benzo Cyclo Butene), acrylic, and an equivalent of them.

Figure 9K:
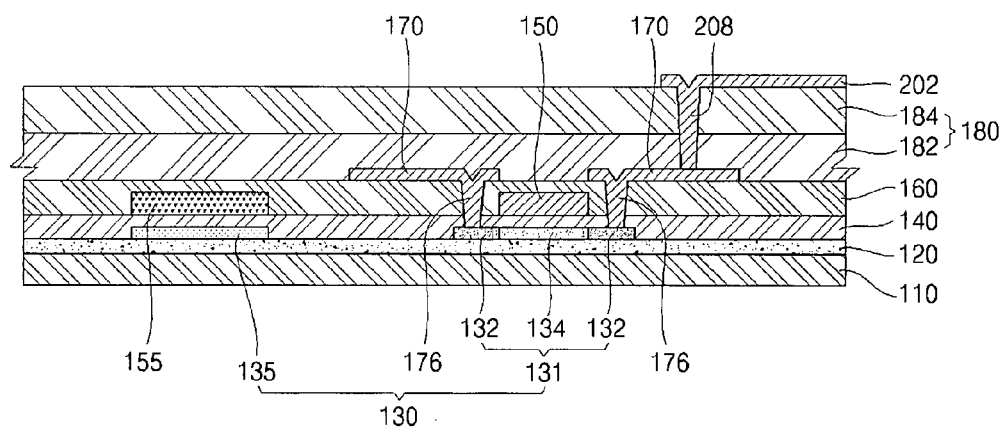

As shown in FIG. 9k, the anode 202 is formed on the insulating layer 180. The anode 202 can be formed by evaporating one selected from among ITO(Indium Tin Oxide), ITO(Indium Tin Oxide)/Ag, ITO(Indium Tin Oxide)/Ag/ITO (IZO: Indium Zinc Oxide), and an equivalent of them. However, the material or method is not limited in the present invention.

For example, the anode 202 can be formed on the upper part of the planarization layer 184 by, for example, using a method selected from among RF sputtering, DC sputtering, ion beam sputtering, and vacuum evaporation. Subsequently, the anode 202 of desirable size is formed at the desirable location through the process of photoresist spread, exposure, development, etching and photoresist strip. Of course, the anode 202 is coupled to the source/drain electrode 170 through the conductive via 208 which penetrates the insulating layer 180.

The distinctive pattern 220 can be formed on the anode 202. The distinctive patter 220 can be available by using the mask equipped with a distinguished pattern for each pixel while the anode 202 is being formed. Here, the distinctive patterns 220 can be formed so that each pixel can be distinguished from one another through visual inspection of the distinctive patterns 200. The shape or location of the distinctive patterns 220 is not limited.

Figure 9L:
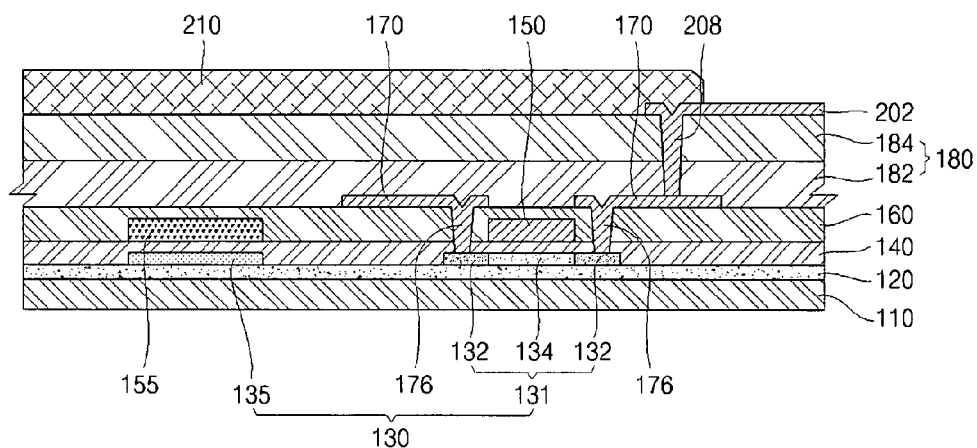

As shown in FIG. 9l, the pixel definition layer 210 is formed on the upper part of the planarization layer 184 and the anode during the next step.

The pixel definition layer 210 is formed, for example, by coating or evaporating at least one selected from among polyimide and its equivalent. After the coating or evaporating, the organic light emitting diode 200 may be exposed to the exterior by the process of photoresist spread, exposure, development, and photoresist strip.

Figure 9M:
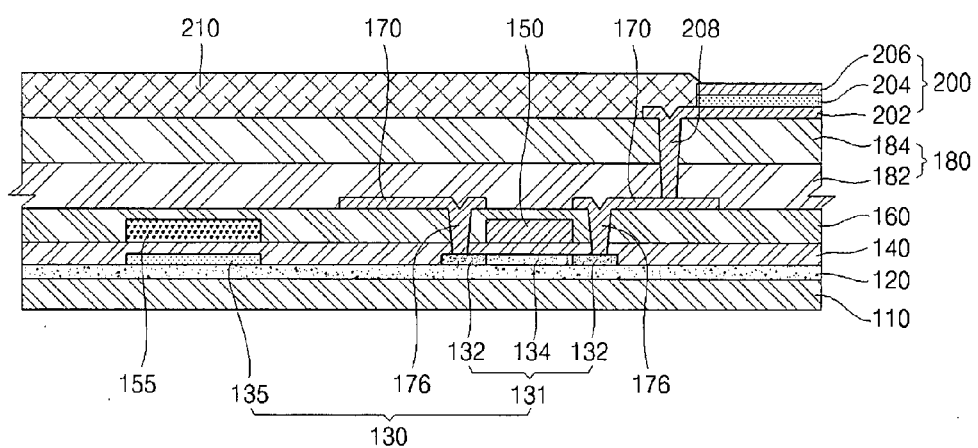

The organic thin film 204 and the cathode 206 are formed on the upper side of the anode 202 in sequence as shown in FIG. 9m.

The organic thin film 204 can, for example, be formed by forming a hole injecting layer (HIL) which enhances the hole injection efficiency, a hole transport layer (HTL) which controls the velocity of the hole, an emitting layer (EML) where exciton is formed as an electron and a hole meet, and an electron injecting layer (EIL) which enhances the electron injection efficiently in sequence. However, the present invention is not limited to the kind of the layers.

For example, the organic thin film 204 can be formed by wet coating method wherein spread is executed in liquid state such as spin coating, deep coating, spray method, screen printing method, inkjet printing method, or by dry coating method such as sputtering and vacuum evaporation.

In addition, in the case of the phosphorescent organic light emitting diode, a hole blocking layer (HBL) can selectively form between the EML and the ETL. An electron blocking layer (EBL) can be formed between the EML and ETL.

The cathode 206 is formed on the upper side of the organic thin film 204. The cathode 206 can, for example, be formed by evaporating at least one selected from among Al, MgAg alloy, MgCa alloy, and an equivalent of them. However, the material and forming method of the cathode 206 is not limited in the present invention. For example, the cathode 206 can be formed by a method selected from among RF sputtering, DC sputtering, ion beam sputtering, and vacuum evaporation. Subsequently, the cathode 206 of desirable size can be formed at desirable location through the process of photoresist spread, exposure, development, etching, and photoresist strip.

Here, the description is focused on the top emission type in which light is generated upwardly. However, the present invention can be applied to the bottom emission type in which light is generated toward the bottom of the substrate 110 and the dual emission type in which light is generated simultaneously toward the top and the bottom.

As described above, because of the organic light emitting display and the fabricating method thereof, a pixel defect and its cause can be determined rapidly during the analyzing process. Because of distinctive patterns formed in the pixels, red, green, and blue pixels are easily distinguished from one another.

Although the certain embodiments have been described with reference to the figures, it will be understood by those skilled in the art that a variety of modifications and variations may be made to the embodiments without departing from the spirit or scope of the present invention. For example, the distinctive patterns may be formed in layers other than those specifically discussed in the example embodiments.

What is claimed is:

1. An organic light emitting display, comprising:
   a substrate; and
   a plurality of pixels of at least first and second primary colors formed on the substrate, wherein each pixel comprises:
   an active layer formed on the substrate;
   a gate insulating layer formed on the active layer;
   a gate electrode formed on the gate insulating layer in a location corresponding to the active layer;
   an interlayer dielectric layer formed on the gate electrode;
   a source or drain electrode formed on the interlayer dielectric layer and coupled to the active layer;
   an insulating layer formed on the source or drain electrode;
   an organic light emitting diode formed on the insulating layer and coupled to the source or drain electrode; and
   a capacitor, configured to store a charge for determining current for the organic light emitting diode, wherein the capacitor of at least one pixel has a distinctive shape corresponding to the primary color of the at least one pixel,
   wherein the distinctive shape comprises at least one line that is not parallel or perpendicular to another line.

2. The organic light emitting display as claimed in claim 1, wherein the active layer includes a semiconductor layer including a source or drain region and a channel region, and a lower electrode of the capacitor.

3. The organic light emitting display as claimed in claim 2, wherein the distinctive shape is formed in the lower electrode of the capacitor.

4. The organic light emitting display as claimed in claim 3, wherein the lower electrode of the capacitor is substantially rectangular, and the distinctive shape is formed at least partially along at least one edge of the rectangle.

5. The organic light emitting display as claimed in claim 3, wherein the lower electrode of the capacitor of each pixel is substantially rectangular, and the at least one pixel has the distinctive shape on an edge corresponding to the primary color of the at least one pixel.

6. The organic light emitting display as claimed in claim 3, wherein the distinctive shape comprises at least part of at least one of a triangular shape, a tetragonal shape, a pentagonal shape, and a semicircular shape.

7. The organic light emitting display as claimed in claim 6, wherein the at least one pixel has the distinctive shape corresponding to the primary color of the at least one pixel.

8. The organic light emitting display as claimed in claim 1, wherein the organic light emitting diode includes an anode, an organic thin film, and a cathode, and the distinctive shape is formed on the anode.

9. The organic light emitting display as claimed in claim 8, wherein the anode is formed so that anode is substantially rectangular, and the distinctive shape is formed at a location corresponding to the primary color of the at least one pixel.

10. The organic light emitting display as claimed in claim 8, wherein the anode of each pixel is substantially rectangular, and the at least one pixel has the distinctive shape on an edge corresponding to the primary color of the at least one pixel.

11. The organic light emitting display as claimed in claim 8, wherein the distinctive shape comprises at least part of at least one of a triangular shape, a tetragonal shape, a pentagonal shape, and a semicircular shape.

12. The organic light emitting display as claimed in claim 11, wherein the at least one pixel has the distinctive shape corresponding to the primary color of the at least one pixel.

13. The organic light emitting display as claimed in claim 1, wherein the distinctive shape is on a plane that is substantially parallel to the plane of the display.

14. An organic light emitting display, comprising:
   a substrate; and
   a plurality of pixels of at least first and second primary colors formed on the substrate, wherein each pixel comprises:
   an active layer formed on the substrate;
   a gate insulating layer formed on the active layer;
   a gate electrode formed on the gate insulating layer in a location corresponding to the active layer;
   an interlayer dielectric layer formed on the gate electrode;
   a source or drain electrode formed on the interlayer dielectric layer and coupled to the active layer;
   an insulating layer formed on the source or drain electrode;
   an organic light emitting diode formed on the insulating layer and coupled to the source or drain electrode; and
   a capacitor, configured to store a charge for determining current for the organic light emitting diode, wherein the capacitor of at least one pixel has a distinctive shape corresponding to the primary color of the at least one pixel, wherein the distinctive shape comprises at least one corner that does is not a 90 or a 270 degree angle.

15. The organic light emitting display as claimed in claim 14, wherein the distinctive shape is on a plane that is substantially parallel to the plane of the display.

* * * * *